United States Patent

Davis

[15] 3,657,563

[45] Apr. 18, 1972

[54] AC COUPLED COMPARATOR AND A/D CONVERTER

[72] Inventor: Billy C. Davis, Round Rock, Tex.

[73] Assignee: Texas Instruments Incorporated, Dallas, Tex.

[22] Filed: Dec. 30, 1969

[21] Appl. No.: 889,144

[52] U.S. Cl. ..................307/251, 340/347 AD, 340/347 SH, 328/147, 328/151

[51] Int. Cl. ........................................................H03k 13/10

[58] Field of Search .............340/347 AD, 347 SH; 328/151, 328/147; 307/251

[56] References Cited

UNITED STATES PATENTS

| | | | |
|---|---|---|---|
| 3,207,998 | 9/1965 | Corney et al | 328/151 X |
| 3,449,741 | 6/1969 | Egerton | 340/347 |
| 3,508,158 | 4/1970 | Marchese | 328/151 X |
| 3,512,140 | 5/1970 | Yokozawa et al | 328/151 X |

*Primary Examiner*—John S. Heyman
*Attorney*—Samuel M. Mims, Jr., James O. Dixon, Andrew M. Hassell, Harold Levine, Rene E. Grossman, Melvin Sharp, John E. Vandigriff and Richards, Harris and Hubbard

[57] ABSTRACT

An analog-to-digital converter is disclosed which utilizes an AC coupled all MOS FET comparator, a resistor ladder for producing a reference voltage, and an all MOS FET control circuit and thus has a very low power consumption.

5 Claims, 3 Drawing Figures

FIG. 1

INVENTOR:
BILLY C. DAVIS

INVENTOR
BILLY C. DAVIS

AC COUPLED COMPARATOR AND A/D CONVERTER

This invention relates generally to voltage comparator systems, and more particularly relates to an AC coupled comparator particularly suitable for use in analog-to-digital converters.

There are many instances when it is desirable to compare an analog voltage with a reference voltage and to produce a binary logic level representative of the relative magnitude. Such a comparator has particular application in step approximation type analog-to-digital converters where an analog voltage is compared to a series of digitally produced reference voltages each selected in response to the results of the previous comparison between the reference voltage and the analog voltage.

Conventional comparators have heretofore employed high gain differential amplifiers with all DC coupling. Such amplifiers must exhibit very low input offset errors and must be very stable with temperature in order to produce conversions with the desired accuracy. Although these two characteristics have been achieved to some extent using bipolar transistor systems, they have not and do not appear to be feasible using only MOS field effect transistors in a DC coupled system.

The present invention is concerned with a comparator system and method which utilizes only AC coupling so as to eliminate input offset errors and temperature instability, and thus provide a comparator and analog-to-digital converter having the desired accuracy with the extremely low power consumption normally associated with field effect systems. In accordance with the present invention, the comparator circuit comprises an amplifier means for producing a logic level at an output in response to a slight change in a normalized voltage level at an input. A first node is coupled to the input by a first capacitor and a first switch means is provided to selectively supply a normalizing voltage to the first node. A second node is coupled to the first node by a second capacitor and second and third switch means are connected to alternately supply an analog voltage or a reference voltage to the second node. The first switch means is operated in synchronism with the second switch means so that the difference in the normalizing voltage and the analog voltage is stored on the second capacitor. Then when the normalizing voltage is disconnected and the reference voltage substituted for the analog voltage, the difference in the analog and reference voltage is transferred to the amplifier.

In more specific embodiments of the invention, an output storage circuit is provided at the output of the amplifier to produce a serial digital output signal. In further embodiments, the comparator is combined with a resistor ladder and control circuitry for sequentially varying the reference voltage applied to the comparator in response to the results of the preceding comparison to produce a serial digital signal representative of the value of the analog input signal.

The comparator also features a normalizing feedback loop around the amplifier to normalize the first capacitor and establish operation of the amplifier in the quiescent region.

The novel features believed characteristic of this invention are set forth in the appended claims. The invention itself, however, as well as other objects and advantages thereof, may best be understood by reference to the following detailed description of illustrative embodiments, when read in conjunction with the accompanying drawings, wherein:

Figure 1:
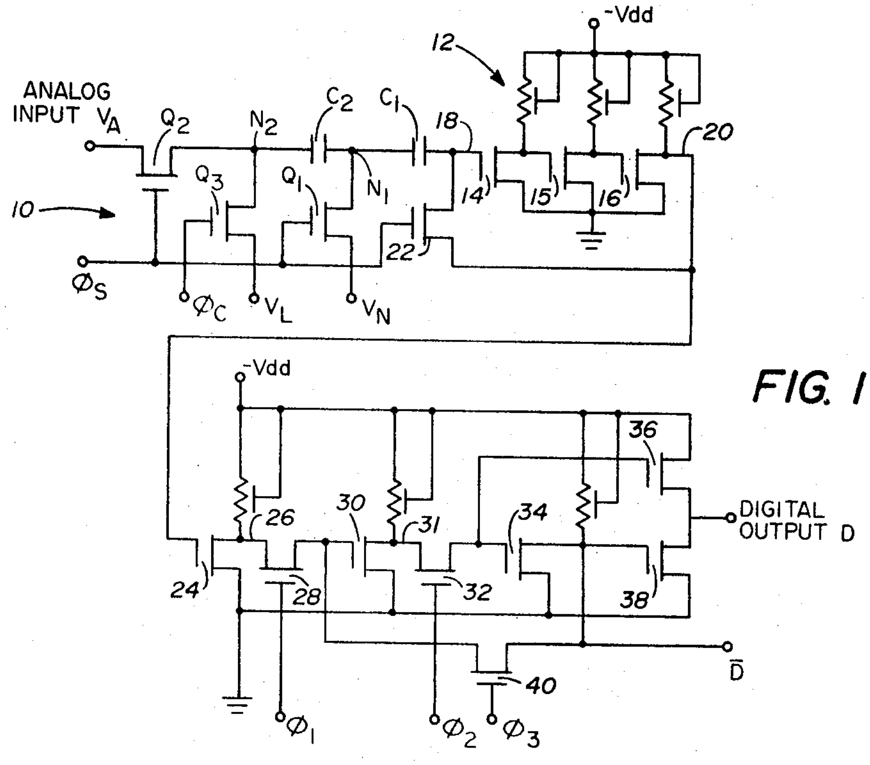
FIG. 1 is a schematic circuit diagram of a comparator circuit in accordance with the present invention.
Figure 2:
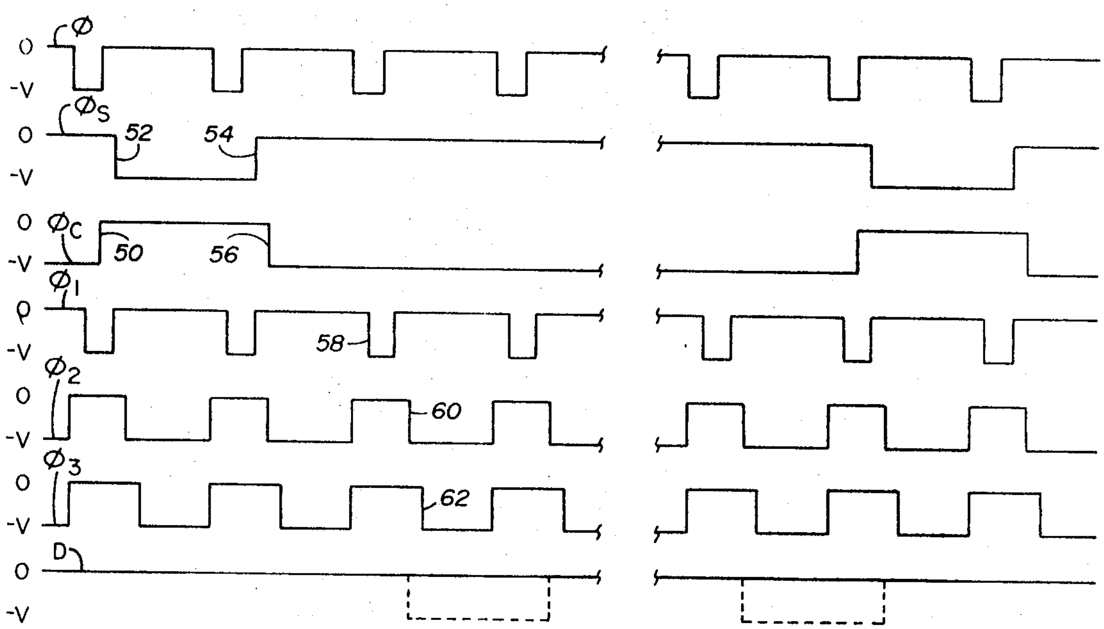
FIG. 2 is a schematic timing diagram which serves to illustrate the operation of the circuit of FIG. 1; and, FIG. 3 is a schematic circuit diagram of a resistance ladder for producing a reference voltage and control logic which in combination with the comparator circuit of FIG. 1 provides an analog-to-digital converter.

Referring now to the drawings, an analog-to-digital converter in accordance with the present invention is indicated generally by reference numeral 10. The converter 10 includes an amplifier indicated generally by the reference numeral 12 having three conventional MOS field effect transistor stages 14, 15, and 16. The gate of transistor 14 is the input 18 of the amplifier, and the drain of transistor 16 is the output 20. The output 20 is connected back to the input 18 by a MOS transistor switch 22.

A first capacitor $C_1$ couples a first node $N_1$ to the input 18 and a second capacitor $C_2$ couples a second node $N_2$ to the first node $N_1$. The channel of MOS transistor $Q_1$ connects a normalizing voltage $V_N$ to node $N_1$. MOS transistor switch $Q_2$ connects the analog input to node $N_2$ and transistor switch $Q_3$ connects a reference voltage $V_L$, typically from a resistor ladder, to mode $N_2$. Transistors 22, $Q_1$ and $Q_2$ are all turned on when a sample and store clock voltage $\phi_S$ goes negative. Transistor $Q_3$ turns on when a compare clock voltage $\phi_C$ goes negative.

The output from the amplifier 12 is connected to the gate of MOS transistor 24 in an inverter stage having an output 26. The output 26 is connected by a sampling MOS transistor 28 to the gate of MOS transistor 30 of a second inverter stage. The output 31 of the second sampling stage is connected by a second MOS transistor 32 to the gate of MOS transistor 34 in a third inverter stage, and to the gate of output MOS transistor 36, which is connected in push-pull configuration with MOS transistor 38. The output from the third stage is connected to the gate of transistor 38 and is also fed back to the gate of transistor 30 by MOS transistor 40. MOS transistors 28, 32 and 40 are operated by clock pulses $\phi_1$, $\phi_2$ and $\phi_3$, respectively, as will be presently described.

The circuit of FIG. 1 is operated by a series of clock pulses $\phi_S$, $\phi_C$, $\phi_1$, $\phi_2$ and $\phi_3$, which are derived from a master clock $\phi$ by a suitable MOS circuit (not illustrated). The upper limit of each wave form represents ground potential, and the lower limit represents a negative voltage approaching the negative drain voltage $-V_{dd}$ of the circuit of FIG. 1. Thus, the various transistors are turned "on" during the negative going pulses.

In the operation of the circuit 10, transistor $Q_3$ is turned off at time 50 and transistors $Q_1$, $Q_2$ and 22 turned on at time 52. As a result, the analog input voltage $V_A$ is applied to node $N_2$, the normalizing voltage $V_N$ is applied to node $N_1$, and the output 20 of the amplifier 12 is connected to the input 18. The difference between the analog input voltage $V_A$ and the normalizing voltage $V_N$ is thus stored on capacitor $C_2$, and the capacitor $C_1$ is normalized so that the amplifier is operating in the quiescent region.

At time 54, transistor switches $Q_1$, $Q_2$ and 22 turn off, and then transistor switch $Q_3$ turns on at time 56, so as to connect the reference voltage $V_L$ to node $N_2$. If the analog voltage $V_A$ is slightly more positive than the reference voltage $V_L$, the capacitors $C_2$ and $C_1$ will transfer the voltage change to input 18 which will result in the saturation of transistor 16 so that the output 20 goes to a voltage approaching ground potential which will hereafter be referred to as the logic "1" level. On the other hand, if the analog input voltage $V_A$ is slightly more negative than the reference voltage $V_L$, the output 20 will go to a voltage approaching the negative drain voltage $-V_{dd}$, which is hereafter referred to as a logic "0" level.

It is important to note that the accuracy of the comparator system thus far described is independent of any change in the values of capacitors $C_1$ and $C_2$, because of the relationship of the analog voltage to the normalizing voltage as the two are stored. It is also independent of any offset errors or drift in the amplifier 12 because at the beginning of each comparison cycle the input 18 and the output 29 are placed at the same voltage level and only a change in the input voltage is detected. It will also be noted that the reference voltage $V_L$ may change during a comparison cycle without affecting the accuracy of the comparison, subject of course, to time limitations imposed by leakage currents.

The logic level at the output 20 of amplifier 12 is applied to the gate of transistor 24. During the negative going pulse from clock $\phi_1$, beginning at time 58, transistor 28 is turned on to store the complement of the logic level on the capacitance of the gate of transistor 30. Then at times 60 and 62, transistors 32 and 40, respectively, are turned on. Assuming that the output 20 and therefore the gate of transistor 24 is at a logic "1"

level, i.e., ground potential, then the output 31 will also be at ground potential. As a result, both transistors 34 and 36 will be turned off, and transistor 38 will be turned on to produce a logic "1" level at the digital output D, which corresponds to the assumed logic "1" level at output 20 from amplifier 12. When transistor 40 is turned on by clock $\phi_3$ at time 62, the positive feedback latches transistors 30, 34 and 36 in the state determined by the logic level to provide continuous access to the information during low speed operation.

On the other hand, if the output from the amplifier 12 is a logic "0" level, transistor 24 will be turned on at time 58 and transistor 30 will be turned off. Then transistors 34 and 36 will be turned on at time 60 causing the digital output D to go negative, representing a logic "0" level, and the sample system will be latched in the logic "0" state at time 62. Thus the digital output D goes negative between successive sample pulses 60 only if the analog input voltage $V_A$ is less than the reference voltage $V_L$, and remains at ground potential if the analog input voltage $V_A$ is more positive than the reference voltage $V_L$.

Figure 3:
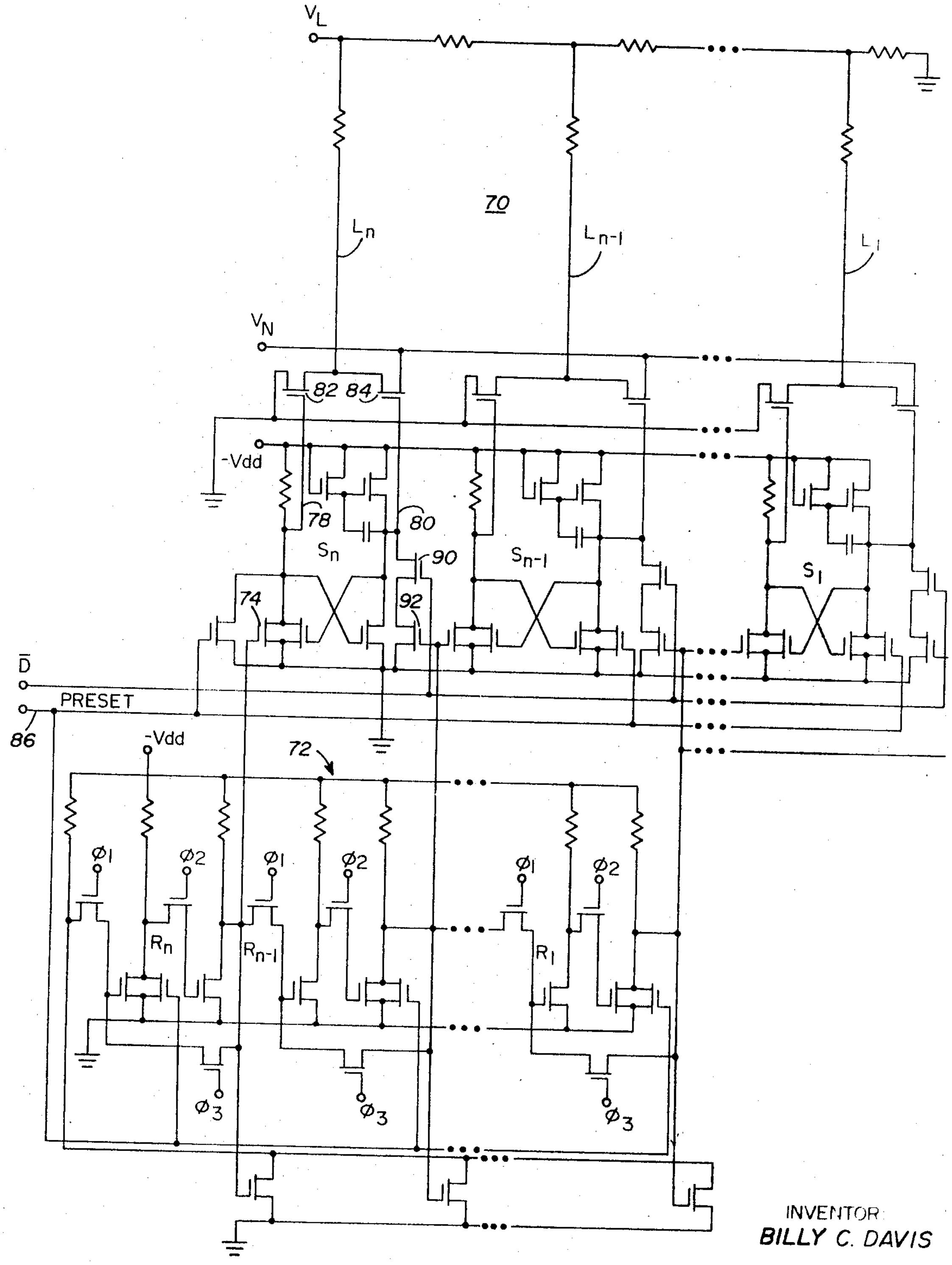

The circuitry of FIG. 1 may be used in combination with the circuitry of FIG. 3 to provide complete analog-to-digital conversion. The circuitry of FIG. 3 includes a conventional resistor ladder network 70 having bits $L_n$, $L_{n-1}$ through $L_1$. A bank 71 of logically controlled switches $S_n$, $S_{n-1}$ and $S_1$ selectively connects bits $L_n$, $L_{n-1}$ and $L_1$, respectively, to either of two reference potentials, which in the circuit illustrated, are the reference voltage $V_N$, and ground. The output from the ladder network 70 is the variable reference voltage $V_L$ for the comparator 10 and the reference voltage $V_N$ is the normalizing voltage.

Each of the switches $S_n$–$S_1$ is a conventional cross coupled latch having logic "1" and logic "0" outputs 78 and 80 which control switches 82 and 84, respectively. Switch $S_n$ is preset to the logic "1" state and the latches of all other switches are preset to the logic "0" state by applying a negative voltage to preset line 86. Bit $R_n$ is preset to a logic "0" state and all other bits $R_{n-1}$–$R_1$ are preset to a logic "1" state by the negative voltage on line 86 after a normalization cycle and prior to the commencement of a comparison cycle.

Thus at the beginning of a comparison cycle, approximately one-half the voltage $-V_N$ is fed back as $V_L$ to the comparator 10. During the first set of clock pulses $\phi_1$, $\phi_2$ and $\phi_3$, a voltage comparison is made and the results of the comparison produced at the digital outputs D and D during the time intervals between points 60 of clock voltage $\phi_2$. During the same period of time, the logic "0" is shifted from bit $R_n$ to bit $R_{n-1}$ of the shift register 72. During each cycle of the clock pulses, the output D is logically combined with the logic "0" output transferred to bit $R_{n-1}$ by the logic gate formed by transistors 90 and 92. If the output D is a logic "0", indicating that the analog voltage $V_A$ is more positive than the ladder reference voltage $V_L$, then both transistors 90 and 92 are turned on. This combined with the logic "1" level applied to transistor 74 from bit $R_n$ switches latch $S_n$ to turn transistor 84 off and transistor 82 on, thus making the reference voltage $V_L$ more positive by the value of ladder bit $L_n$. At the same time, the logic "0" output from bit $R_{n-1}$ switches transistor 75 of switch $S_{n-1}$ on, thus switching the latch from the negative voltage supply $V_N$. The voltage $V_L$ is then approximately one fourth the negative voltage $V_N$.

On the other hand, if the analog input voltage is more negative than the ladder reference voltage $V_L$, output D will be at a logic "1" level and transistor 90 will not be turned on. This will maintain switch $S_n$ in the original logic "1" state, and the contribution of bit $L_n$ to the ladder reference voltage $V_L$ will be retained so that $V_L$ will be approximately three fourths the negative voltage $V_N$. This procedure is repeated for each of the remaining bits of the ladder network as the logic "0" is shifted through the shift register 72. The digital output D is then monitored during the appropriate time intervals so that the presence of absence of the negative going pulses is a digital representation of the analog voltage $V_A$.

It is important to note that the entire analog-to-digital converter is formed using MOS filed effect transistors. All MOS transistors can therefore be fabricated on a single integrated circuit. The ladder network 70 can be fabricated using thick film technology. As a result, the analog-to-digital converter has a power consumption substantially less than any analog-to-digital converter heretofore devised, and in addition may be packaged in an extremely small volume. Because of the size requirement for capacitors $C_1$ and $C_2$, they are necessarily external to the integrated circuit.

Although a preferred embodiment of the invention has been described in detail, it is to be understood that various changes, substitutions and alterations can be made therein without departing from the spirit and scope of the invention as defined by the appended claims.

What is claimed is:

1. In a comparator circuit, the combination of:
amplifier means for producing a logic level at an output in response to a slight change in a normalized voltage level at an input,
a first node coupled by a first capacitor to the input,
first switch means for selectively applying a normalizing voltage to the first node,
a second mode coupled to the first node by a second capacitor,
second switch means for selectively connecting an analog input voltage to the second node,
third switch means for selectively connecting a reference voltage to the second node, and
logic means connected to the output of the amplifier means for storing the logic level at the output of the amplifier means in response to a timing signal.

2. The combination of claim 1 wherein the amplifier means and the switch means are formed on a common substrate using field effect devices.

3. In a comparator circuit, the combination of:
amplifier means for producing a logic level at an output in response to a slight change in a normalized voltage level at an input,
a first node coupled by a first capacitor to the input,
first switch means for selectively applying a normalizing voltage to the first node,
a second node coupled to the first node by a second capacitor,
second switch means for selectively connecting an analog input voltage to the second node,
third switch means for selectively connecting a reference voltage to the second node, and
control circuit means for sequentially closing the first and second switch means and opening the third switch means to normalize the system and sample and store the analog voltage, and then opening the first and second switch means and closing the third switch means to compare the stored analog voltage to the reference voltage.

4. In a comparator circuit, the combination of:
amplifier means for producing a logic level at an output in response to a slight change in a normalized voltage level at an input,
a first node coupled by a first capacitor to the input,
first switch means for selectively applying a normalizing voltage to the first node,
a second node coupled to the first node by a second capacitor,
second switch means for selectively connecting an analog input voltage to the second node,
third switch means for selectively connecting a reference voltage to the second node,
reference means for producing a binary series of reference voltage levels connected to supply the reference voltage level through the third switch means to the second node, and
control means for switching the reference means in a predetermined sequence in response to the logic level at the output of the amplifier for producing a serial digital signal representative of the analog input voltage.

5. In an analog-to-digital converter, the combination of amplifier means for producing a logic level at an output in response to a slight change in voltage level at an input, a first node coupled by a first capacitor to the input, first switch means for selectively applying a normalizing voltage to the first node to stabilize the amplifier in the quiescent mode, a second node coupled to the first node by a second capacitor, second switch means for selectively connecting an analog input voltage to the second node, third switch means for selectively connecting a reference voltage to the second node, a resistor ladder network connected to apply the reference voltage through the third switch means to the second node, means for repeatedly sampling and storing the logic level at the output of the amplifier, and control means for operating the circuit means to sequentially a. close the first and second switch means and open the third switch means, b. open the first and second switch means and close the third switch means, and c. repeatedly sample and store the logic level from the amplifier while adjusting the reference voltage in a predetermined manner dependent upon a previously sampled and stored logic level.

* * * * *